(12) United States Patent
Huang

(10) Patent No.: US 9,395,773 B1
(45) Date of Patent: Jul. 19, 2016

(54) LAPTOP COOLING PAD WITH TRANSVERSE FAN

(71) Applicant: Cheng Yu Huang, New Taipei (TW)

(72) Inventor: Cheng Yu Huang, New Taipei (TW)

( * ) Notice: Subject to any disclaimer, the term of this patent is extended or adjusted under 35 U.S.C. 154(b) by 0 days.

(21) Appl. No.: 14/709,677

(22) Filed: May 12, 2015

(51) Int. Cl.
  *G06F 1/20* (2006.01)
  *H05K 7/20* (2006.01)
  *G06F 1/16* (2006.01)

(52) U.S. Cl.
  CPC ............ *G06F 1/203* (2013.01); *H05K 7/20181* (2013.01); *G06F 1/1632* (2013.01)

(58) Field of Classification Search
  CPC .... G06F 1/203; G06F 1/1623; H05K 7/20181
  USPC ........................ 361/679.46, 679.55
  See application file for complete search history.

(56) References Cited

U.S. PATENT DOCUMENTS

| | | | | |
|---|---|---|---|---|
| 7,859,840 B2* | 12/2010 | Chang | ................... | G06F 1/1632 361/694 |
| 7,885,068 B2* | 2/2011 | Seo | .......................... | G06F 1/203 361/694 |
| 2010/0226088 A1* | 9/2010 | Huang | .................... | G06F 1/203 361/679.48 |

* cited by examiner

*Primary Examiner* — Dion R Ferguson
*Assistant Examiner* — Mandeep S Buttar
(74) *Attorney, Agent, or Firm* — Jackson IPG PLLC; Demian K. Jackson

(57) ABSTRACT

A laptop cooling pad includes a cover including a top louver, an intermediate recess, openings between the louver and the recess, a rear channel communicating the recess with an open rear end, and two stop members pivotably disposed on the rear end of the cover; a casing releasaby secured to the cover and including extendible legs pivotally on a bottom of the front portion of the cover; a transverse fan in the casing and under the louver, the transverse fan including a shock absorbing member; and a PCB for supplying power to the transverse fan and configured to control the transverse fan. In response to activating the transverse fan, cooling air is drawn into the transverse fan via the louver and flows upward and rearward respectively.

3 Claims, 7 Drawing Sheets

LAPTOP COOLING PAD WITH TRANSVERSE FAN

BACKGROUND OF THE INVENTION

1. Field of the Invention

The invention relates to laptop cooling devices and more particularly to a laptop cooling pad having a transverse fan and other beneficial components to further improve temperature operating conditions.

2. Description of Related Art

Laptops are widely used by people for various works. However, heat may quickly build up when a laptop is operating. How to effectively dissipate the heat is thus an issue to be addressed.

A conventional cooling pad for use with a laptop comprises a bottom plate having a transverse ventilation portion, and a cover plate having a transverse ventilation frame corresponding to the transverse portion. The transverse ventilation portion is provided with a transverse groove; and at least one fan each held by a support. The support has front and rear upper edges with symmetrically arranged resilient retainers, and has left and right edges with symmetrically arranged pushing nodes. The support is placed in the ventilation portion of the bottom plate with the pushing nodes thereof inserted into the transverse grove so that the pushing nodes are exposed to be pushed manually. After the cover plate is secured to the bottom plate, manually pushing the pushing nodes makes the fan move transversely in the cooling pad along the ventilation portion.

While the laptop cooling pad enjoys its success in the market, continuing improvements in the exploitation of laptop cooling pad of this type are constantly sought.

SUMMARY OF THE INVENTION

It is therefore one object of the invention to provide a laptop cooling pad comprising a cover including a louver on a top of a front portion, an intermediate recess, a plurality of openings disposed between the louver and the recess, a rear channel communicating the recess with an open rear end of the cover, and two stop members pivotably disposed on the rear end of the cover; a casing releasaby secured to the cover and including a plurality of extendible legs pivotally disposed on a bottom of a front end; a transverse fan disposed in the casing and under the louver, the transverse fan including a shock absorbing member; and a PCB for supplying power to the transverse fan and configured to control the transverse fan; wherein in response to activating the transverse fan, cooling air is drawn into the transverse fan via the louver, in a first path the cooling air flows to the rear end of the cooling pad via the openings, the recess, and the channel, and in a second path the cooling air flows upward via the openings and the recess.

The above and other objects, features and advantages of the invention will become apparent from the following detailed description taken with the accompanying drawings.

DETAILED DESCRIPTION OF THE INVENTION

Figure 1:
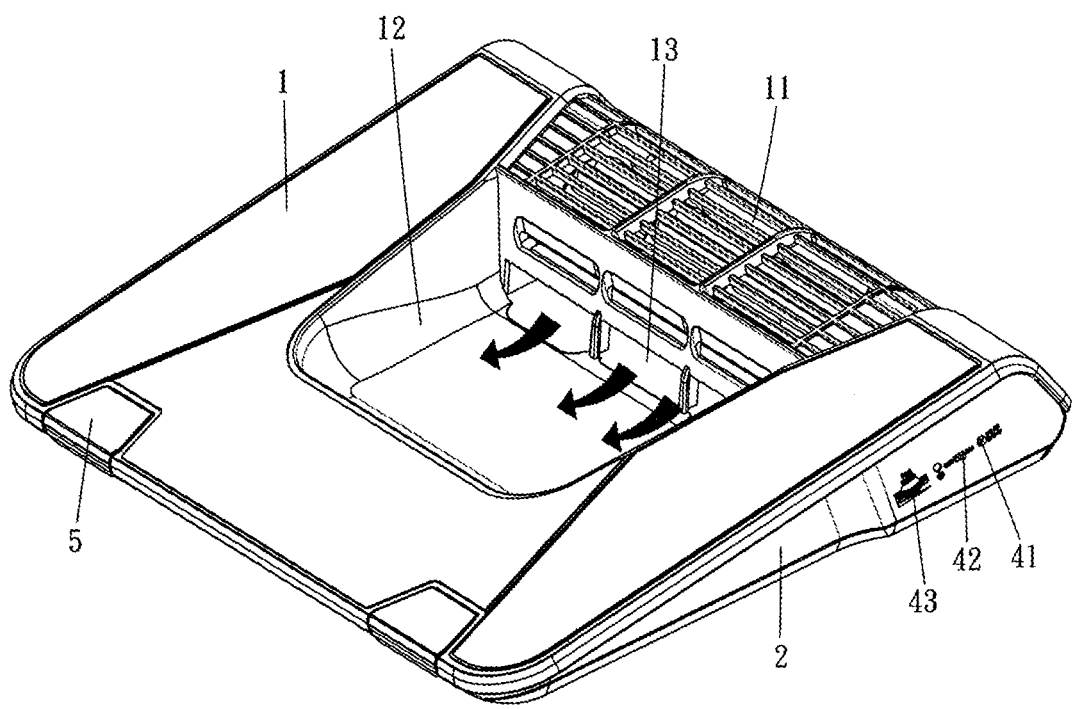
FIG. 1 is a perspective view of a laptop cooling pad according to a first preferred embodiment of the invention.
Figure 2:
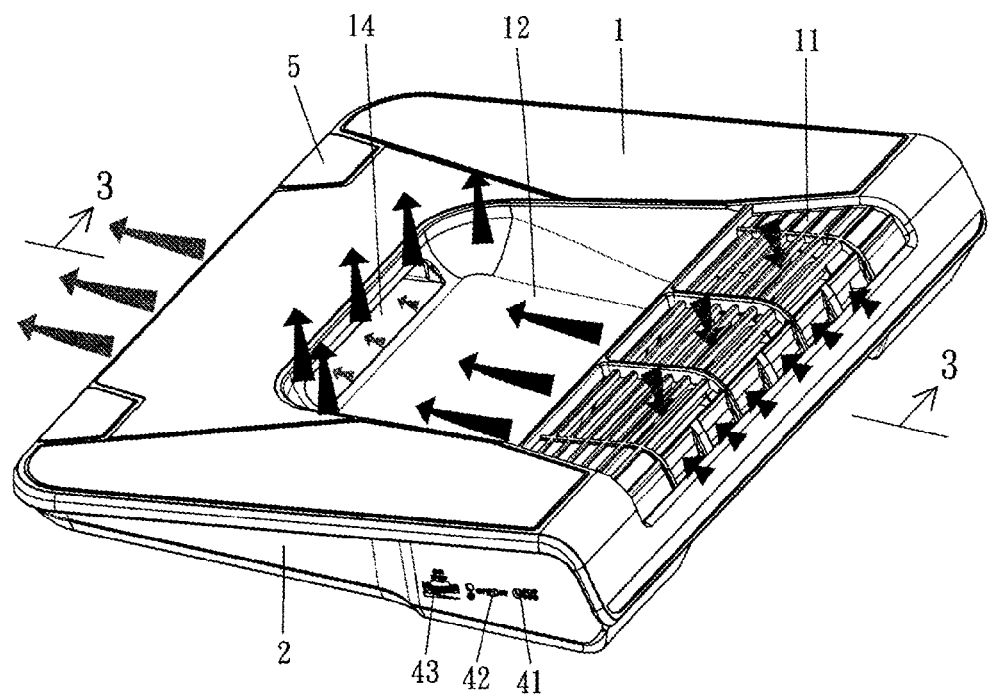
FIG. 2 is another perspective view of the laptop cooling pad.
Figure 3:
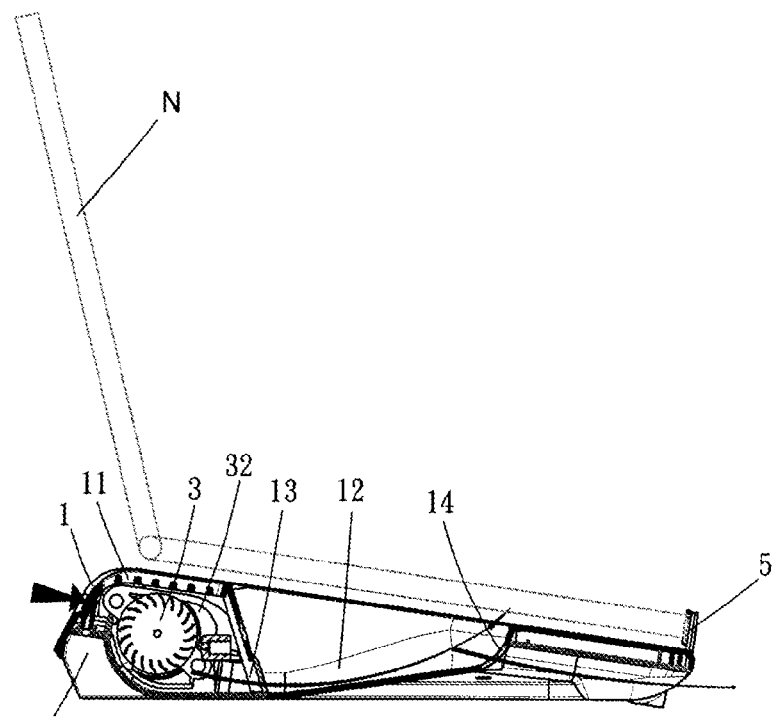
FIG. 3 is a sectional view taken along line 3-3 of FIG. 2 with a laptop shown in phantom.
Figure 4:
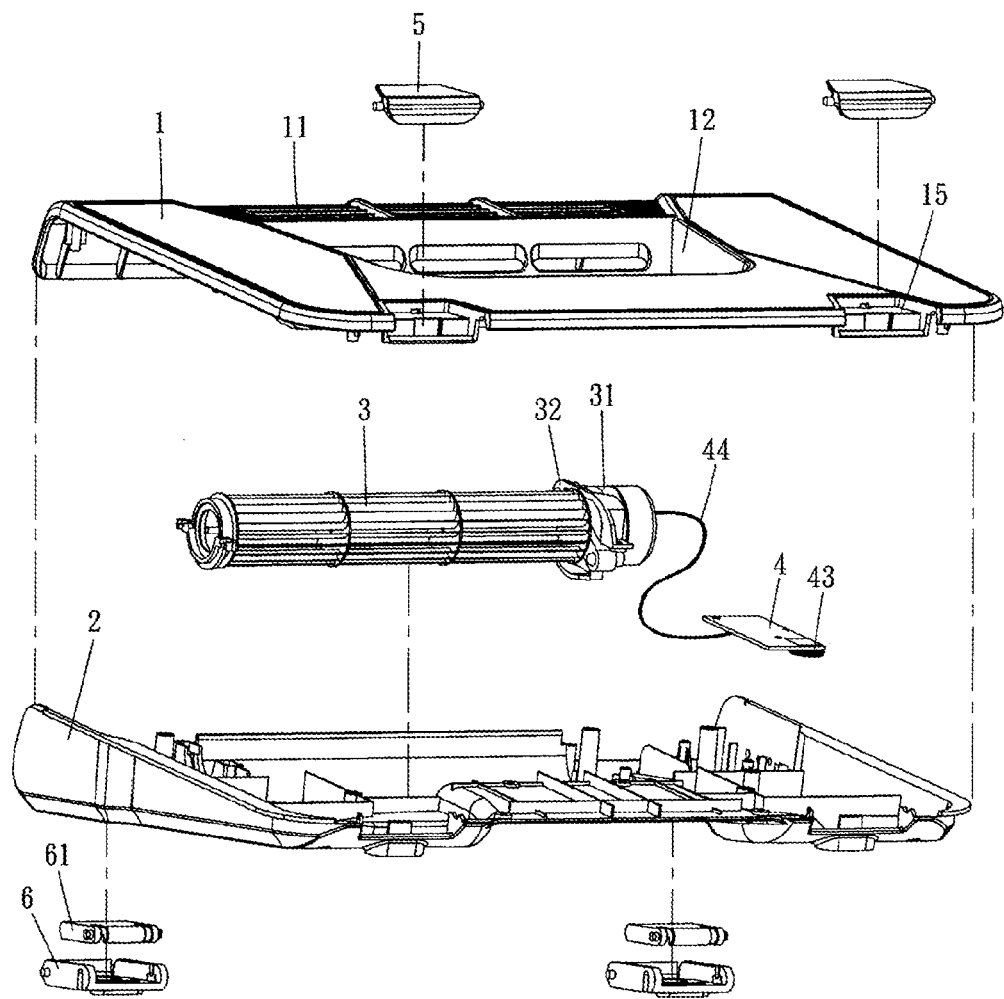
FIG. 4 is an exploded view of the laptop cooling pad.
Figure 5:
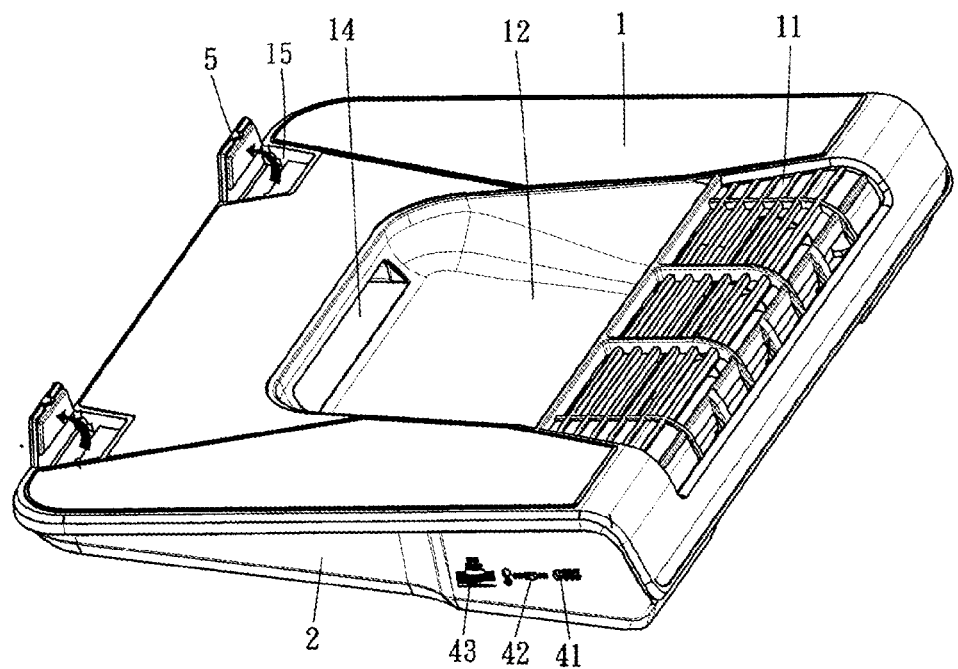
FIG. 5 is a view similar to FIG. 2 showing the process of opening the stop members.
Figure 6:
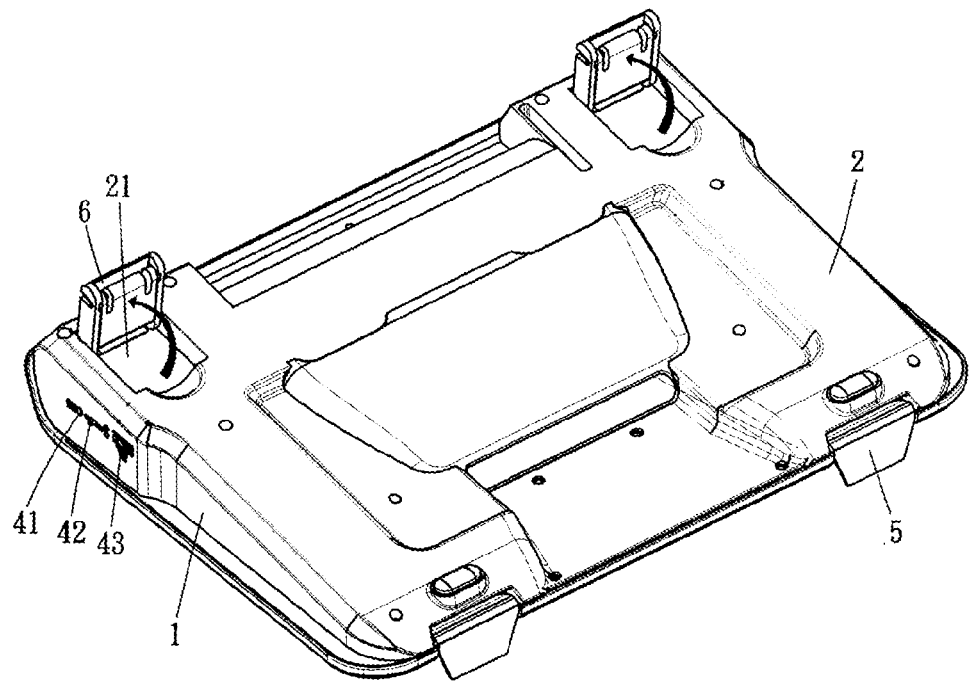
FIG. 6 is a perspective view of a bottom of the laptop cooling pad showing the process of opening the legs.
Figure 7:
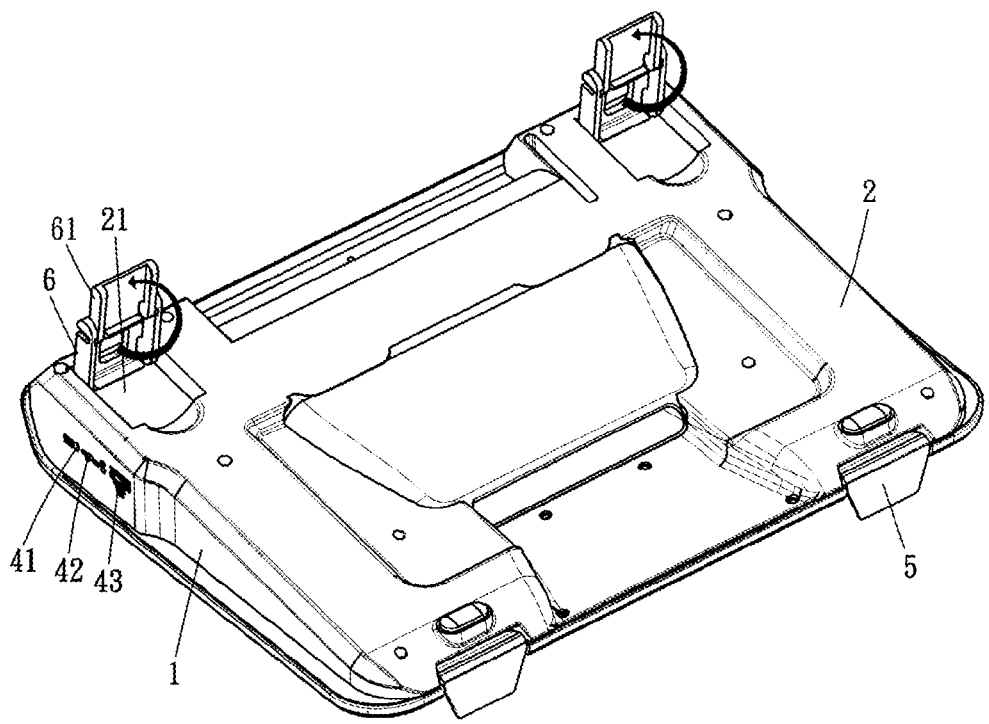
FIG. 7 is a view similar to FIG. 6 showing the open legs.
Figure 8:
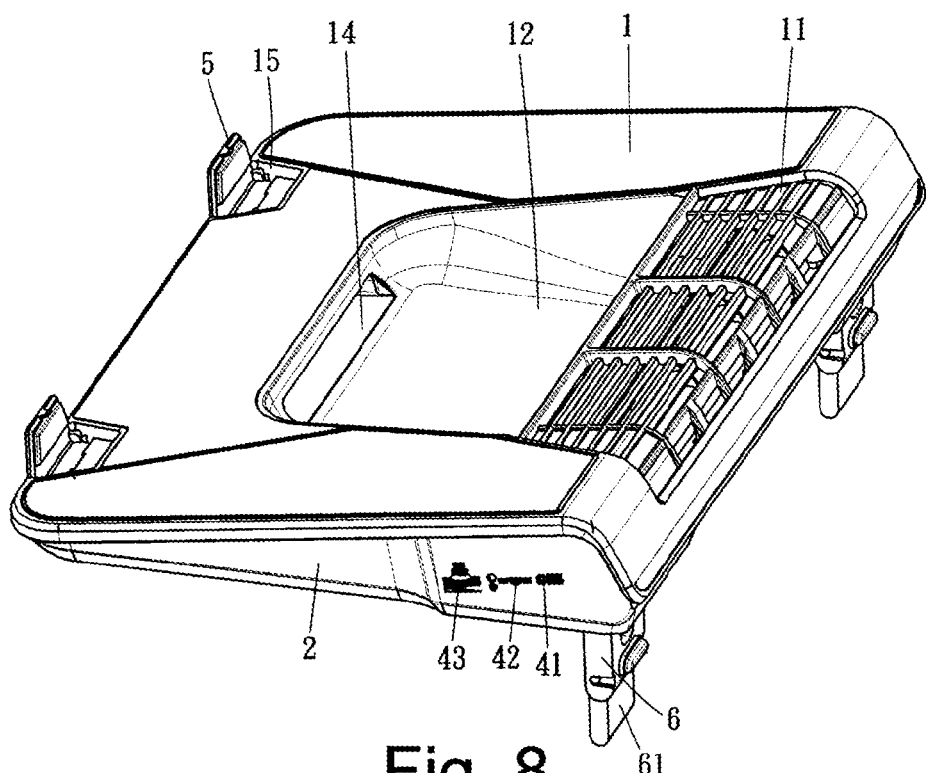
FIG. 8 is a view similar to FIG. 2 showing one of the laptop cooling pad supported by the fully extended legs.

Referring to FIGS. 1 to 8, a laptop cooling pad in accordance with a first preferred embodiment of the invention comprises the following components as discussed in detail below.

A cover 1, a casing 2, a transverse fan 3, a printed circuit board (PCB) 4, two stop members 5, and two legs 6 are provided. The cover 1 includes a louver 11 on a top of a front portion with the transverse fan 3 disposed below, an intermediate recess 12, a plurality of openings 13 communicating the transverse fan 3 with the recess 12, a rear channel 14 communicating the recess 12 with an open rear end of the cover 1, and two wells 15 proximate two corners of the rear end of the cover 1. The stop members 5 are pivotably disposed on the wells 15. The transverse fan 3 is driven by a motor 31. A shock absorbing member 32 disposed between the motor 31 and the transverse fan 3.

The PCB 4 is provided on an inner surface of one side of the casing 2. A power cord socket 41 is provided on one side of the casing 2 proximate one leg 6. An on/off switch 42 is provided besides the power cord socket 41. A speed selector 43 is provided on the PCB 4 and projects out of one side of the casing 2. The exposed speed selector 43 is adjacent to the on/off switch 42. The PCB 4 is electrically connected to the power cord socket 41, the on/off switch 42, and the speed selector 43 respectively. Further, a power cord 44 is electrically interconnected the PCB 4 and the motor 31 so that the motor 31 can be driven to activate the transverse fan 3 when a power cord is electrically interconnected the power cord socket 41 and an external power supply and the on/off switch 42 is switch to on.

Two cavities 21 are provided on two corners of a bottom of a front end of the casing 2 respectively. The legs 6 are pivotably disposed in the cavities 21 respectively. The leg 6 includes a pivotal extension 61 so that a distance between a supporting surface and the bottom of the front end of the laptop cooling pad can be increased to a second distance from a first distance (i.e., the extension 61 being not extended) by pivoting the extension 61. The cover 1 and the casing 2 are assembled to finish a completed laptop cooling pad.

In use, a user may counterclockwise pivot the stop members 5 about 90 degrees until being stopped. Further, the user may counterclockwise pivot the legs 6 about 90 degree until being stopped. Furthermore, the user may extend the extensions 61 to increase the distance between a supporting surface and the bottom of the front end of the laptop cooling pad. In addition, the user may open a laptop N and place it on the top of the cooling pad. A rear end of the laptop N is supported by the upright stop members 5. Thus, the laptop N is positioned. Next, the user may turn on the on/off switch 42 to activate the transverse fan 3 and select a desired rotation speed of the transverse fan 3. Cooling air drawn into the transverse fan 3 via the louver 11. Further, a small portion of the cooling air flows to the rear end of the cooling pad via the openings 13, the recess 12, and the channel 14. A substantial portion of the cooling air flows upward from an intermediate portion of the cooling pad to cool the laptop N via the openings 13 and the recess 12. As a result, the laptop N can be effectively cooled.

Figure 9:
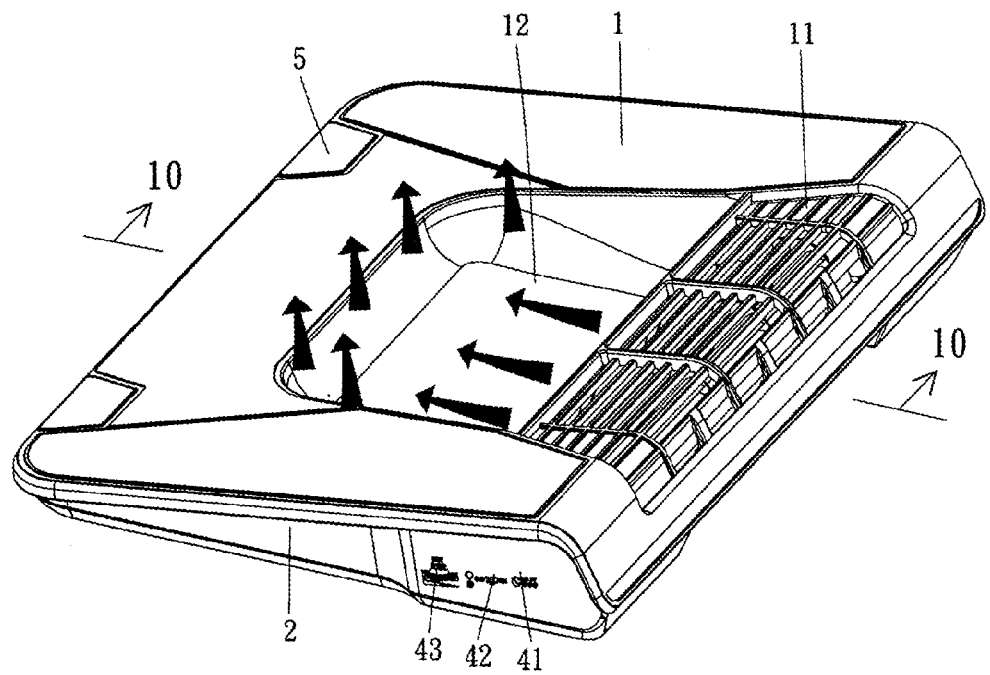
FIG. 9 is perspective view of a laptop cooling pad according to a second preferred embodiment of the invention.
Figure 10:
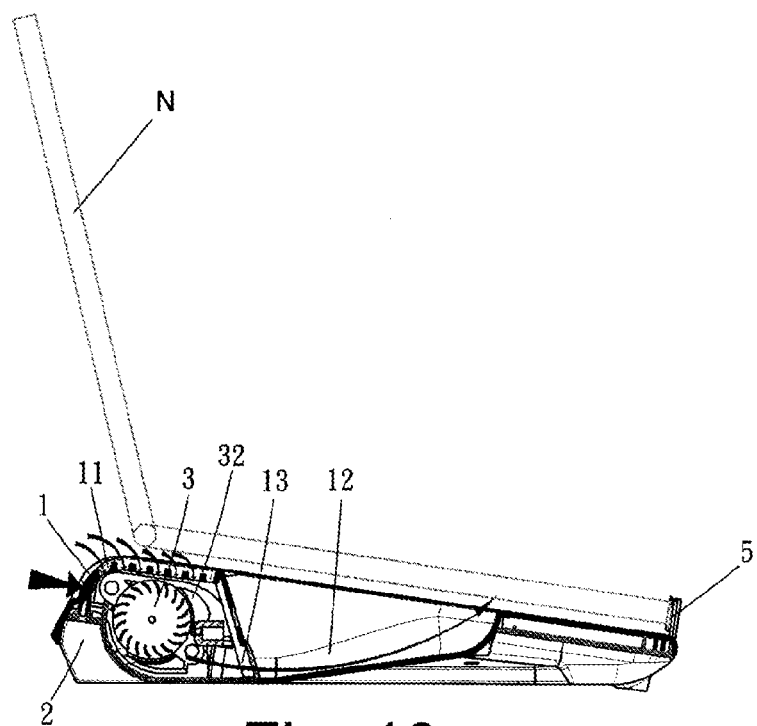
FIG. 10 is a sectional view taken along line 10-10 of FIG. 9 with a laptop shown in phantom.

Referring to FIGS. 9 and 10, a laptop cooling pad in accordance with a second preferred embodiment of the invention is shown. The characteristics of the second preferred embodiment are substantially the same as that of the first preferred embodiment except the following: The rear channel is eliminated. Thus, almost all cooling air flows upward from the intermediate portion of the cooling pad to cool the laptop N via the openings 13 and the recess 12.

Figure 11:
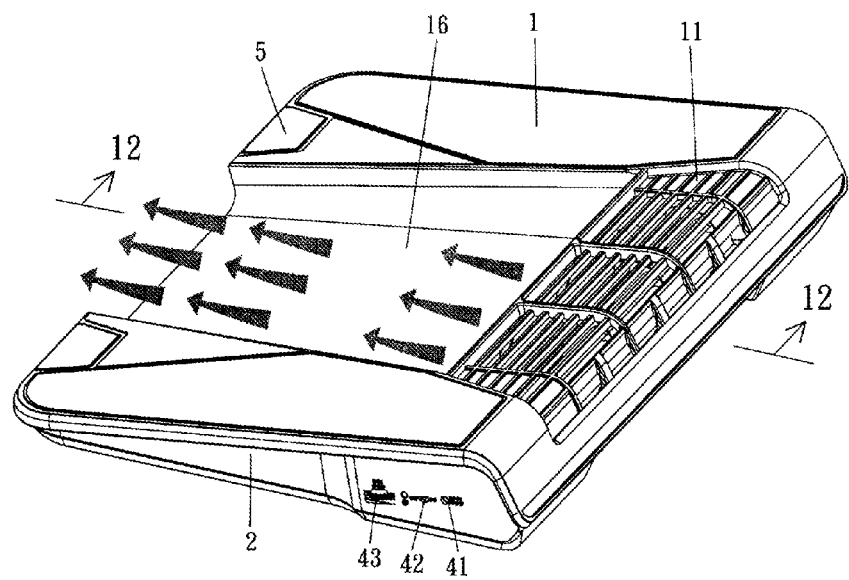
FIG. 11 is perspective view of a laptop cooling pad according to a third preferred embodiment of the invention.
Figure 12:
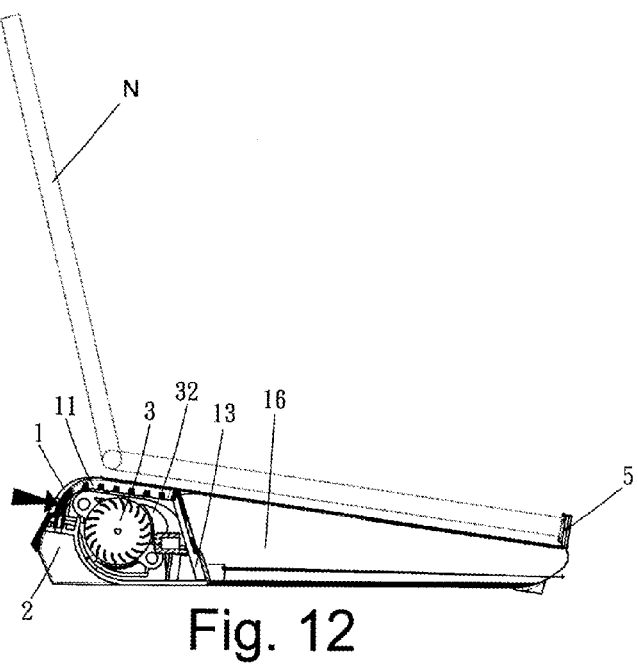
FIG. 12 is a sectional view taken along line 12-12 of FIG. 11 with a laptop shown in phantom.

Referring to FIGS. 11 and 12, a laptop cooling pad in accordance with a third preferred embodiment of the invention is shown. The characteristics of the third preferred embodiment are substantially the same as that of the first preferred embodiment except the following: The recess and the channel are replaced by a single passage 16 for allowing cooling air to flow through.

While the invention has been described in terms of preferred embodiments, those skilled in the art will recognize that the invention can be practiced with modifications within the spirit and scope of the appended claims.

What is claimed is:

1. A laptop cooling pad comprising:
   a cover including a louver on a top of a front portion, an intermediate recess, a plurality of openings disposed between the louver and the recess, a rear channel communicating the recess with an open rear end of the cover, and two stop members pivotably disposed on the rear end of the cover;
   a casing releasaby secured to the cover and including a plurality of extendible legs pivotally disposed on a bottom of the front portion;
   a transverse fan disposed in the casing and under the louver, the transverse fan including a shock absorbing member; and
   a printed circuit board (PCB) disposed in the casing for supplying power to the transverse fan and configured to control the transverse fan;
   wherein in response to activating the transverse fan, cooling air is drawn into the transverse fan via the louver, in a first path the cooling air flows to the rear end of the cooling pad via the openings, the recess, and the channel, and in a second path the cooling air flows upward via the openings and the recess.

2. A laptop cooling pad comprising:
   a cover including a louver on a top of a front portion, an intermediate recess, a plurality of openings disposed between the louver and the recess, and two stop members pivotably disposed on the rear end of the cover;
   a casing releasaby secured to the cover and including a plurality of extendible legs pivotally disposed on a bottom of the front portion;
   a transverse fan disposed in the casing and under the louver, the transverse fan including a shock absorbing member; and
   a printed circuit board (PCB) disposed in the casing for supplying power to the transverse fan and configured to control the transverse fan;
   wherein in response to activating the transverse fan, cooling air is drawn into the transverse fan via the louver, and the cooling air flows upward via the openings and the recess.

3. A laptop cooling pad comprising:
   a cover including a louver on a top of a front portion, an intermediate recess, a plurality of openings disposed between the louver and the recess, a passage formed between the openings and a rear end of the cover, and two stop members pivotably disposed on the rear end of the cover;
   a casing releasaby secured to the cover and including a plurality of extendible legs pivotally disposed on a bottom of the front portion;
   a transverse fan disposed in the casing and under the louver, the transverse fan including a shock absorbing member; and
   a printed circuit board (PCB) disposed in the casing for supplying power to the transverse fan and configured to control the transverse fan;
   wherein in response to activating the transverse fan, cooling air is drawn into the transverse fan via the louver, and the cooling air the cooling air flows out of the cover via the openings and the passage.

* * * * *